United States Patent
Alvarez et al.

(10) Patent No.: US 6,956,282 B1
(45) Date of Patent: Oct. 18, 2005

(54) STABILIZER/SPACER FOR SEMICONDUCTOR DEVICE

(75) Inventors: Robert Alvarez, Garland, TX (US); Paul R. Moehle, Seekonk, MA (US); Harold T. Kellher, Attleboro, MA (US)

(73) Assignee: Texas Instruments Incorporated, Dallas, TX (US)

( * ) Notice: Subject to any disclaimer, the term of this patent is extended or adjusted under 35 U.S.C. 154(b) by 1614 days.

(21) Appl. No.: 08/964,518

(22) Filed: Nov. 5, 1997

(51) Int. Cl.[7] ............ H01L 23/495; H01L 23/48; H01L 23/50

(52) U.S. Cl. ............ 257/666; 257/676; 257/670; 257/668; 257/669; 257/679; 257/671; 672/677; 672/717; 672/718; 672/719; 672/726; 672/797

(58) Field of Search .............. 257/666, 676, 257/670, 668, 669–673, 677, 678, 973, 717–719, 257/726, 727, 797

(56) References Cited

U.S. PATENT DOCUMENTS

| | | | | |
|---|---|---|---|---|
| 5,424,577 A | * | 6/1995 | Suzuki et al. ............... | 257/670 |
| 5,528,077 A | * | 6/1996 | Tane et al. ............... | 257/669 |
| 5,559,364 A | * | 9/1996 | Hojyo ............... | 257/674 |
| 5,568,363 A | * | 10/1996 | Kitahara ............... | 257/676 |
| 5,637,919 A | * | 6/1997 | Grabbe ............... | 257/797 |
| 5,648,890 A | * | 7/1997 | Loo et al. ............... | 257/719 |
| 5,723,899 A | * | 3/1998 | Shin ............... | 257/691 |
| 5,731,962 A | * | 3/1998 | Imura ............... | 257/674 |
| 5,821,457 A | * | 10/1998 | Mosley et al. ............... | 257/678 |
| 5,824,950 A | * | 10/1998 | Mosley et al. ............... | 257/678 |
| 5,859,471 A | * | 1/1999 | Kuraishi et al. ............... | 257/670 |

* cited by examiner

Primary Examiner—Alexander Oscar Williams
(74) Attorney, Agent, or Firm—Wade James Brady, III; Frederick J. Telecky, Jr.

(57) ABSTRACT

The invention is a leadframe/stabilizer (35) for use with semiconductor devices. Stabilizer (35) is for stabilizing the space between of lead frame leads (36–39) and improving the lead to lead spacing and to improve lead tip planarity. Stabilizer (35) extends partially along the length of and on each side of said lead frame leads (36–39) and include a die pad mount (40), integral with and forming a part of said stabilizer 35.

14 Claims, 5 Drawing Sheets

STABILIZER/SPACER FOR SEMICONDUCTOR DEVICE

FIELD OF THE INVENTION

This invention relates to semiconductor devices, and more particularly to a ceramic or plastic stabilizer/spacer for devices having high pin count lead frames.

BACKGROUND OF THE INVENTION

In producing delicate, high pin count lead frames with closely spaced inner leads, polyimide or kapton tape is often applied to maintain lead-to-lead spacing and to stabilize Lead tip planarity. This operation is typically done after stamping or etching the lead frame and after plating of the lead frame. It involves indexing and precisely locating a lead frame unit and applying heat and pressure to a piece of precisely cut and located polyimide tape to affix it to the lead frame. This operation is expensive, time consuming and subjects the high value added plated lead frame to additional mechanical handling. Ionic contamination is often found in polyimide taped lead frames.

BRIEF SUMMARY OF THE INVENTION

The invention is a leadframe/stabilizer for use with semiconductor devices. The stabilizer is for stabilizing the space between lead frame leads and improving the lead to lead spacing, and to improve lead tip planarity. The stabilizer extends partially along the length of and on each side of said lead frame leads and a die pad mount, integral with and forming a part of said stabilizer, is mounted where the die mount pad of a lead frame would be.

The technical advance represented by the invention, as well as the objects thereof, will become apparent from the following description of a preferred embodiment of the invention when considered in conjunction with the accompanying drawings, and the novel features set forth in the appended claims.

DESCRIPTION OF A PREFERRED EMBODIMENT

Figure 1:
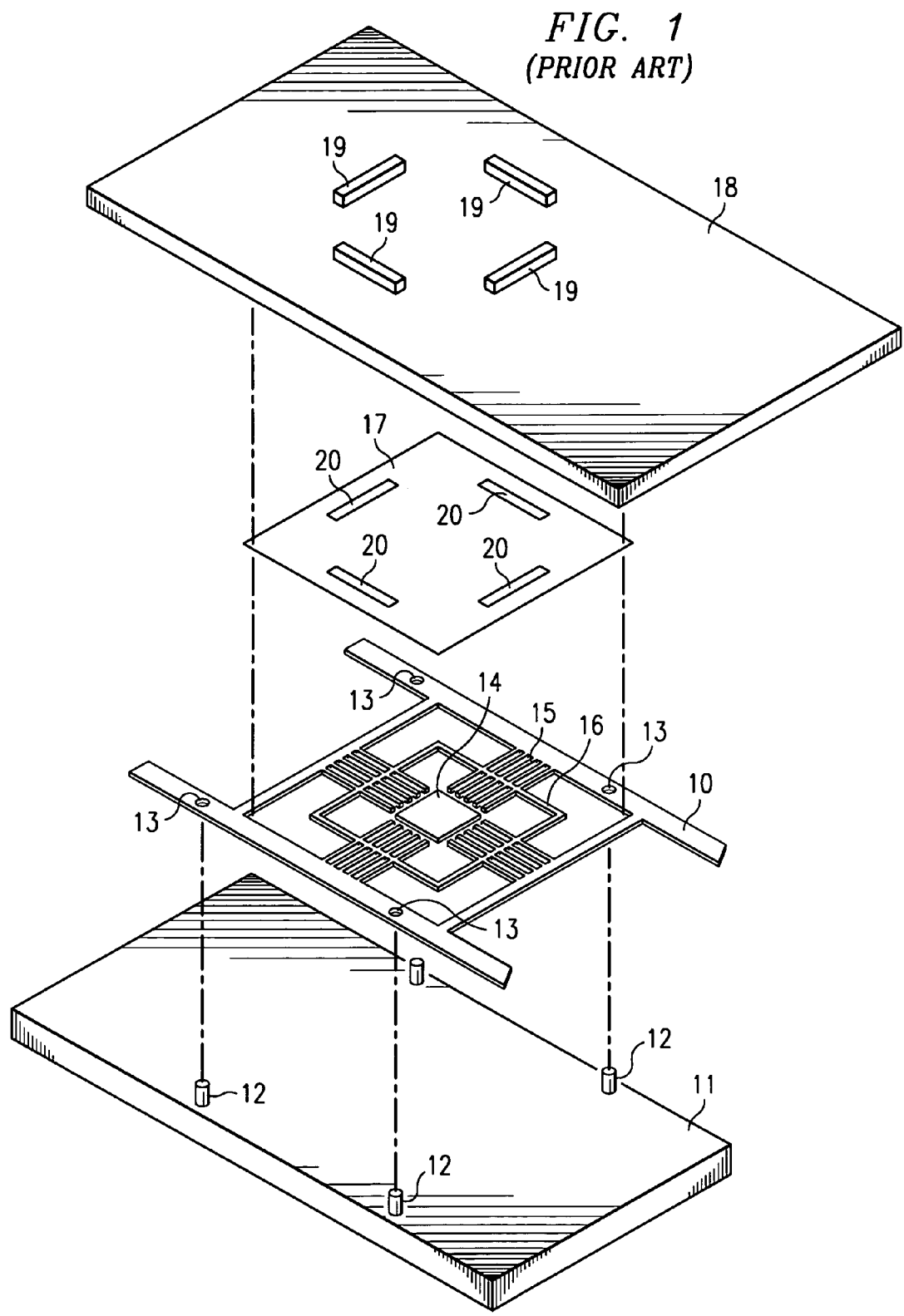
FIG. 1 illustrates a fixture and lead frame illustrating the use of a punch and die to place a prior art polyimide tape on the leads.
Figure 2:
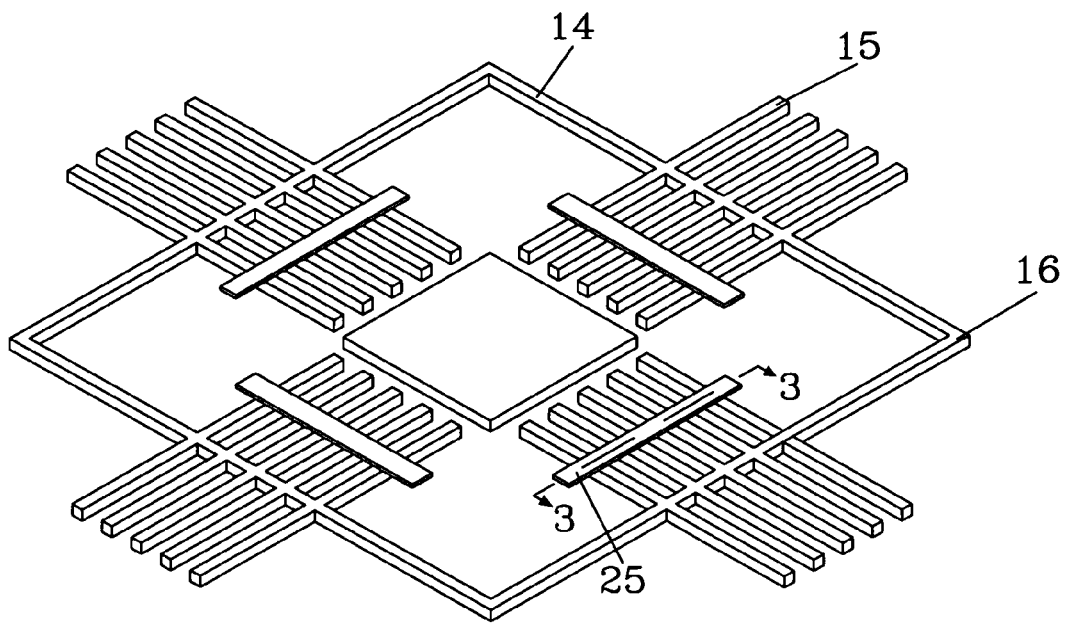
FIG. 2 illustrates a single lead frame with the polyimide stabilizer in place.
Figure 3:
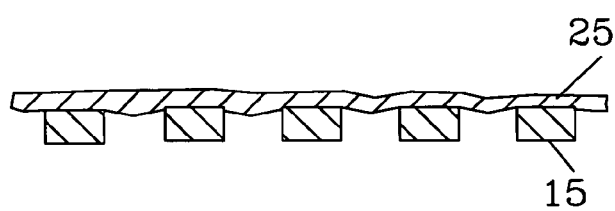
FIG. 3 is a cross-sectional view of the polyimide stabilizer/spacer on the leads.

FIGS. 1, 2 and 3 illustrate a prior art method for providing a stabilizer spacer for lead frame leads in high pin count lead frames. A lead frame 10 having index holes 13 is placed on a heater block 11 having indexing pins 12 hold the lead frame in place on the block. A die 17 having die holes 20 is placed over lead frame 10 such that the die holes 20 span leads 15. A sheet of polyimide 18 is placed over the die and a punch having punch elements 19 corresponding to the openings 20 in die 17 is placed over the polyimide. Punch elements 19 punch small strips of polyimide material out of sheet 18 onto leads 15. FIG. 2 shows the strips 25 of polyimide on leads 15 after the strips 25 have been punched out of sheet 18. FIG. 3 is a cross sectional view of polyimide strips 25 and leads 15. Heat from a heater block supplies heat to aid in the adhesion of strips 25 to leads 15.

Figure 4:
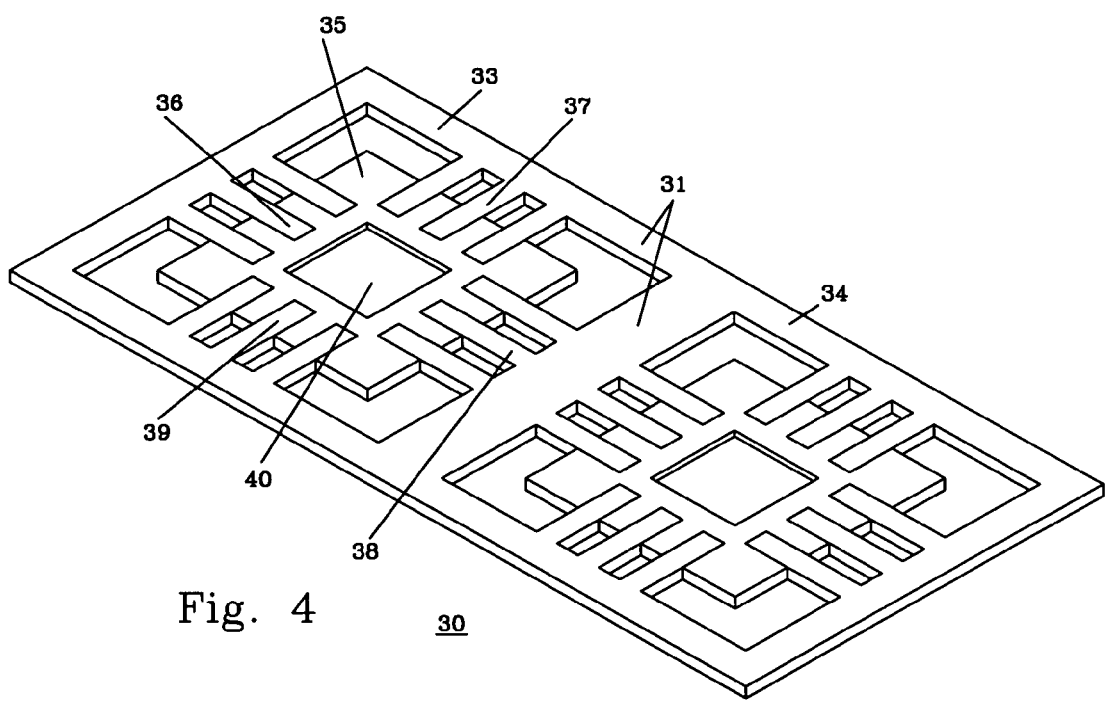
FIG. 4 is a lead frame strip of two stabilized lead frames according to the present invention.

FIG. 4 shows a lead frame strip 30 having two lead frames 33 and 34. Usually a strip of lead frames has more than two lead frames, but for purpose of illustration, only two lead frames are illustrated. Each lead frame has a plurality of sets of lead frame leads on each side, for example, sets shown as 36, 37, 38 and 39. While three leads frame lead are shown on each side, there usually are many more leads, and the number of leads depends upon the particular semiconductor device to be mounted within the lead frame. The lead frames in lead frame strip 30 are held together by side and cross rails 31.

A die pad/lead frame lead stabilizer 35 is molded such that a portion of the stabilizer 35 extends between the lead frame leads and forms a die pad area 40 on which the semiconductor die is mounted. The stabilizer material may extend up to, for example 50% of the lead frame length, but the length of extension between the lead frame leads may depend upon the length of the lead frame leads.

Area 40 may be a recessed area as shown, or may be a flat non-recessed area. Stabilizer 35 is of a suitable plastic material such as molding compounds used in encapsulating semiconductor devices or a ceramic compound. Utilization of a non-metal material for the die pad mount may be important in some devices, since in some integrated circuit devices, chip-to-metal mounting of the semiconductor die on a metal die mount pad causes movement of the semiconductor die with respect to the die mount pad because of thermal expansion of the metal die pad.

Figure 5:
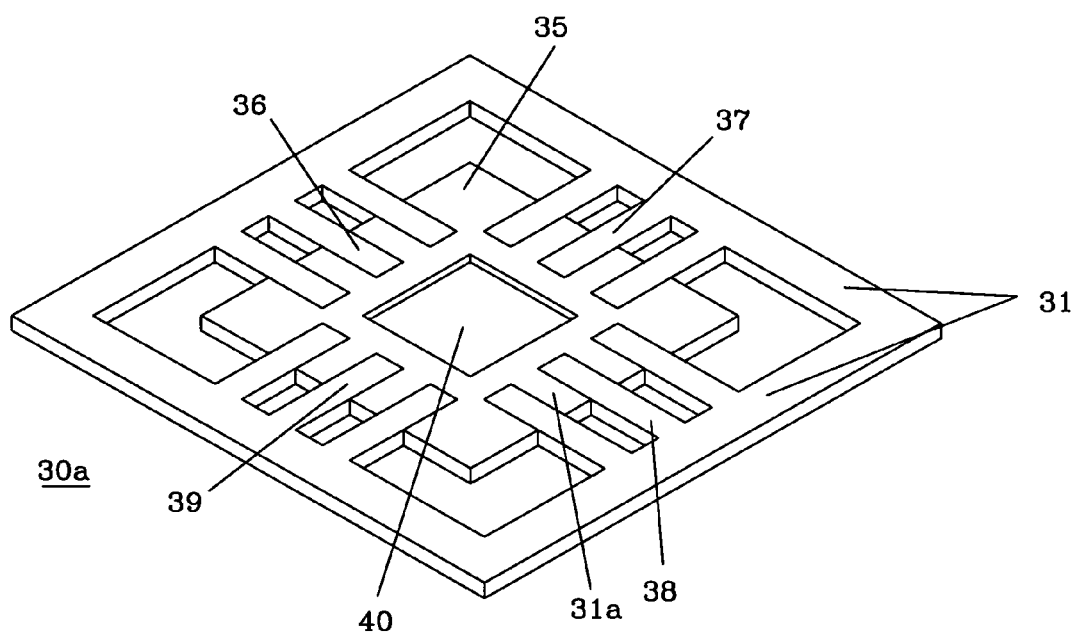
FIG. 5 shows a single lead frame.
Figure 6:
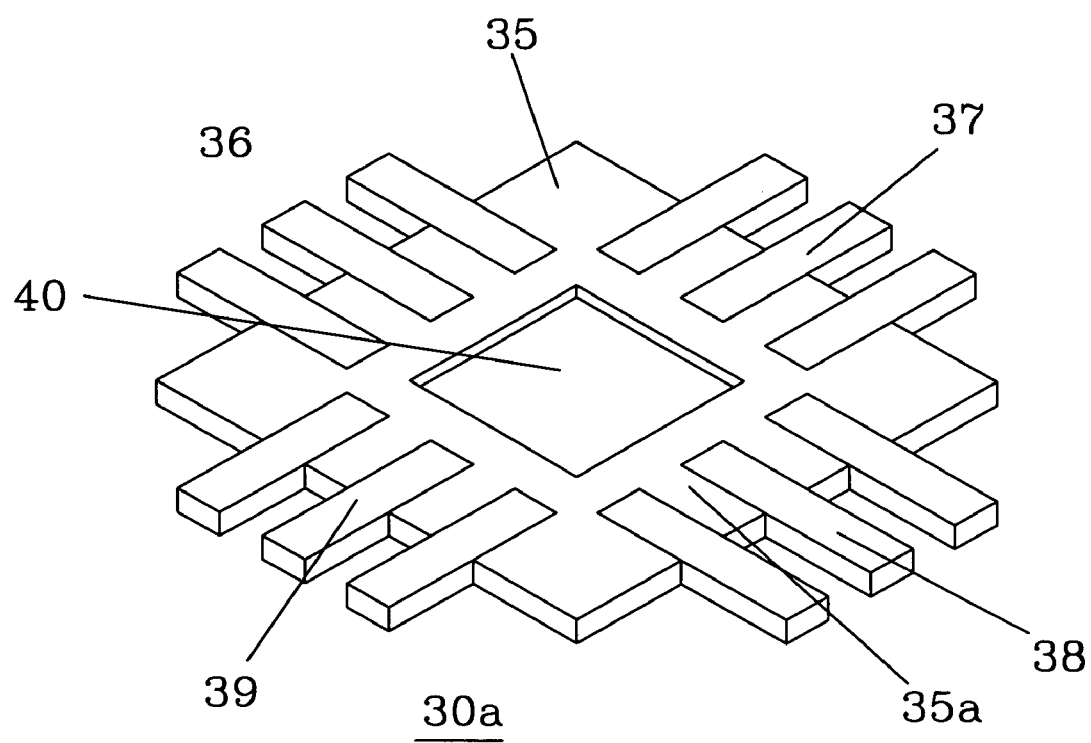
FIG. 6 shows a lead frame removed from the lead frame strip.

FIG. 5 shows a single lead frame 30a after separation from the strip 30 of lead frames. Lead frame 30a still has part of the lead

What is claimed:

1. A leadframe/stabilizer for use with semiconductor devices, comprising:
   (a) an electrically conductive leadframe having a central semiconductor die-receiving region and a plurality of leadframe leads extending outwardly from said central die-receiving region; and
   (b) a stabilizer extending partially along the length of and on each side of said leadframe leads to improve leadframe planarity, said stabilizer including:
      (i) a die pad mount integral with and forming a part of said stabilizer disposed beneath said central semiconductor die-receiving region for retaining a semiconductor die thereon.

2. The leadframe/stabilizer according to claim 1, wherein said stabilizer and die pad mount is made of an insulating material.

3. The leadframe/stabilizer according to claim 1, wherein said stabilizer and die pad mount is made of a plastic material.

4. The leadframe/stabilizer according to claim 1, wherein said stabilizer and die pad mount is made of a ceramic material.

5. The leadframe/stabilizer according to claim 1, wherein said die pad mount has a recess in one surface into which a semiconductor die is mounted.

6. A leadframe stabilizer for use with semiconductor devices, comprising:

(a) an electrically conductive leadframe having a central semiconductor die- receiving region and a plurality of leadframe leads extending outwardly from said central die-receiving region; and (b) a stabilizer extending partially along the length of and on each side of said lead leadframe leads to improve leadframe planarity, said stabilizer including:

(i) a die pad mount integral with and forming a part of said stabilizer disposed beneath said central semiconductor die-receiving region for retaining a semiconductor die thereon;

(ii) a recess in one surface of said die pad mount; and (c) a semiconductor die mounted in said recess.

7. The leadframe/stabilizer according to claim 6, wherein said stabilizer is made of an insulating material.

8. The leadframe/stabilizer according to claim 1, wherein said stabilizer is made of a plastic material.

9. The leadframe/stabilizer according to claim 1, wherein said stabilizer is made of a ceramic material.

10. A method for stabilizing the leads of a lead frame and providing a semiconductor die mount pad, comprising the steps of:

(a) providing a leadframe having a central semiconductor die-receiving region and a plurality of leadframe leads extending outwardly from said central die-receiving region;

(b) providing a stabilizer, said stabilizer having a die pad integral therewith and disposed beneath said central semiconductor die-receiving region; and (c) adhering said stabilizer along part of the length and on each side of said leadframe leads to improve leadframe planarity.

11. The method according to claim 10, including the step of forming a recessed area in the die pad for mounting of a semiconductor die in said recessed area.

12. The method according to claim 10, wherein said stabilizer is made of an insulating material.

13. The method according to claim 10, wherein said stabilizer is made of a plastic material.

14. The method according to claim 10, wherein said stabilizer is made of a ceramic material.

* * * * *

UNITED STATES PATENT AND TRADEMARK OFFICE
CERTIFICATE OF CORRECTION

PATENT NO. : 6,956,282 B1  Page 1 of 1
APPLICATION NO. : 08/964518
DATED : October 18, 2005
INVENTOR(S) : Robert Alvarez et al.

It is certified that error appears in the above-identified patent and that said Letters Patent is hereby corrected as shown below:

On the Title page, Item (60) should read,
Claim priority from provisional application number 60/032,500 filed November 27, 1996.

Signed and Sealed this

Thirteenth Day of May, 2008

JON W. DUDAS
*Director of the United States Patent and Trademark Office*